(12) United States Patent
Kamiya

(10) Patent No.: US 8,429,486 B2
(45) Date of Patent: Apr. 23, 2013

(54) DECODING DEVICE, DATA STORAGE DEVICE, DATA COMMUNICATION SYSTEM, AND DECODING METHOD

(75) Inventor: Norifumi Kamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 383 days.

(21) Appl. No.: 12/744,516

(22) PCT Filed: Oct. 28, 2008

(86) PCT No.: PCT/JP2008/069488
§ 371 (c)(1),
(2), (4) Date: May 25, 2010

(87) PCT Pub. No.: WO2009/075143
PCT Pub. Date: Jun. 18, 2009

(65) Prior Publication Data
US 2010/0251063 A1  Sep. 30, 2010

(30) Foreign Application Priority Data
Dec. 13, 2007  (JP) .................................. 2007-321928

(51) Int. Cl.
*H03M 13/00* (2006.01)
(52) U.S. Cl.
USPC .......................................... 714/752; 714/786
(58) Field of Classification Search .................. 714/752, 714/786
See application file for complete search history.

(56) References Cited

U.S. PATENT DOCUMENTS

| | | | |
|---|---|---|---|
| 6,141,787 A | 10/2000 | Kunisa | |
| 7,178,080 B2 * | 2/2007 | Hocevar | 714/752 |
| 7,237,171 B2 * | 6/2007 | Richardson | 714/752 |
| 7,454,685 B2 * | 11/2008 | Kim et al. | 714/758 |
| 2007/0150789 A1 * | 6/2007 | Choi et al. | 714/758 |

FOREIGN PATENT DOCUMENTS

| | | |
|---|---|---|
| CN | 85103579 A | 11/1986 |
| EP | 1699138 A | 9/2006 |
| EP | 1819054 A | 8/2007 |
| JP | 2004186940 A | 7/2004 |
| JP | 2005051469 A | 2/2005 |
| JP | 2005223440 A | 8/2005 |
| JP | 2006191246 A | 7/2006 |
| JP | 2007081601 A | 3/2007 |
| JP | 2007089064 A | 4/2007 |

(Continued)

OTHER PUBLICATIONS

Supplementary European Search Report for EP 08 85 8406 completed Jan. 17, 2012.

(Continued)

*Primary Examiner* — Yolanda L Wilson

(57) ABSTRACT

A data converting means generates first interim data held in one-to-one correspondence to columns vectors from data stored in a first storage means and data stored in a second storage means. A check node processing means generates second interim data for updating the data stored in the first storage means based on the sum of the first interim data and received data. The data converting means updates the data stored in the second storage means using the first interim data, and updates the data stored in the first storage means using the second interim data generated by the check node processing means. Decoded data are generated by a process carried out by the data converting means and the check node processing means.

7 Claims, 8 Drawing Sheets

FOREIGN PATENT DOCUMENTS

| | | | |
|---|---|---|---|
| JP | 2007295564 | A | 11/2007 |
| KR | 20060125501 | A | 12/2006 |
| RU | 2006109470 | A | 7/2006 |
| RU | 2310274 | C1 | 11/2007 |

OTHER PUBLICATIONS

J. Sha et al., "Efficient Decoder Implementation for QC-LDPC Codes", Communications, Circuits and Systems Proceedings, IEEE, XP002632603, 2006, pp. 2498-2502.

Russian Decision on Grant for RU2010128905/08(041005) dated Jul. 25, 2011.

International Search Report for PCT/JP2008/069488 mailed Jan. 6, 2009.

R. G. Gallager, "Low-Density Parity-Check Codes", IRE Transactions on Information Theory, Jan. 1962, pp. 21-28.

D. J. C. MacKay, "Good Error-Correcting Codes Based on Very Sparse Matrices", IEEE Transactions on Information Theory, vol. 45, No. 2, Mar. 1999, pp. 399-431.

E. Sharon et al., "An Efficient Message-Passing Schedule for LDPC Decoding", Proceedings 2004 IEEE Convention of Electrical and Electronics Engineers in Israel, Sep. 2004, pp. 223-226.

E. Yeo et al., "High Throughput Low-Density Parity-Check Decoder Architectures", 2001 IEEE Global Telecommunications Conference, Nov. 2001, pp. 3019-3024.

Chinese Office Action for CN200880120809.0 Aug. 27, 2012.

* cited by examiner

DECODING DEVICE, DATA STORAGE DEVICE, DATA COMMUNICATION SYSTEM, AND DECODING METHOD

The present application is the National Phase of PCT/JP2008/069488, filed Oct. 28, 2008, which claims priority based on Japanese patent application No. 2007-321928 filed on Dec. 13, 2007, and incorporates herein the entire disclosure thereof by reference.

TECHNICAL FIELD

The present invention relates to the art of decoding an information sequence from data which have been coded by adding a redundancy sequence to the information sequence and correcting errors using the redundancy sequence.

BACKGROUND ART

Communication systems for satellite communications and mobile communications have requirements for system configurations such as reduced electric power and smaller antennas. To satisfy such requirements, an error correction coding technology has been introduced for achieving a large coding gain.

A low-density parity-check code is known as an error correcting code having a very large coding gain, and is being introduced into various communication systems and storage devices for recording data. The low-density parity-check code does not mean a particular error correction coding process, but is a collective term for error correcting codes having a sparse check matrix. A sparse check matrix is a check matrix mostly composed of 0s and having few 1s. The low-density parity-check code is characterized by a check matrix.

By selecting a sparse check matrix and using a repetitive decoding process, it is possible to realize an error correction coding process which is close to theoretical limitations and which has a very large coding gain (see Documents 1, 2). A sum-product algorithm or a min-sum algorithm may be used for such a process.

Document 4 discloses an example of a process of decoding a low-density parity-check code. A decoding device divides received data into blocks having a certain length, holds received data to be error-corrected and data called a message produced in the decoding process for each of the blocks, and corrects errors of the received data while updating the messages using a check matrix. It is assumed that one block comprises N received data (N represents an integer greater than 1). It is also assumed that the check matrix comprises elements each represented by a matrix of N rows and R columns (R represents a positive integer of N or smaller) of 0s or 1s.

If each item of the received data is expressed by b bits (b represents a positive integer), then a storage area of b×N bits is required to hold a block of N received data. Since as many messages as the number of non-zero elements of the check matrix are held, a storage area of b×(the number of non-zero elements) is required to hold messages. The non-zero elements refer to elements each having a value of 1, not 0.

The decoding process can be carried out at a high speed by holding data in RAM (random access memory) and performing parallel processing on data while simultaneously accessing a plurality of data. For performing parallel processing on increased data that can simultaneously be accessed, it is necessary to divide and record the data in a plurality of RAMs. Consequently, the decoding device needs an increased circuit scale and the process of generating addresses is complicated.

The problem regarding the number of RAMs can be solved by a method based on device configurations (see Document 5). However, such a method greatly reduces the error ratio of the decoding process. Although there is an approach to simplify the circuit arrangement by using shift registers, rather than RAMs (see Document 1), such an approach results in an increased circuit scale if the length N of a block exceeds several tens of thousands or if the number of redundant bits is large and the coding ratio is significantly small.

DOCUMENT LIST

Document 1: JP 2007-089064A
Document 2: Robert Gallager, "Low-Density Parity-Check Codes", IEEE Transactions on Information Theory, January 1962, pages 21 through 28
Document 3: D. J. C. MacKay, "Good Error-Correcting Codes Based on very sparse matrices", IEEE Transactions on Information Theory, March 1999, pages 399 through 431
Document 4: Eran Sharon, Simon Litsyn, Jacob Goldberger, "An Efficient Message-Passing Schedule for LDPC Decoding", Proceedings 2004 IEEE Convention of Electrical and Electronics Engineers in Israel, September 2004, pages 223 through 226
Document 5: E Yeo, P. Pakzad, B. Nikolic, V Anantharam, "High Throughput Low-Density Parity-Check Decoder Architecture", 2001 IEEE Global Telecommunications Conference, November 2001, pages 3019 through 3024

DISCLOSURE OF THE INVENTION

If the low-density parity-check code is decoded by the above method, a large storage area is required to store data that are temporarily generated in the decoding process. For example, according to the decoding method disclosed in Document 4, for example, a storage area whose size is proportional to the number of non-zero elements of the check matrix is required to hold the temporarily generated data (messages).

In particular, since the satellite communications and mobile communications impose strict conditions on device scales and power consumption, there are strong demands for a reduction in the storage capacity and the circuit scale. If a method which does not use data that are temporarily generated in the decoding process is employed, then the storage area is reduced because no data need to be held. However, such a method tends to reduce the error ratio of the decoding process.

As described above, it has been difficult to reduce the storage area while at the same time maintain a good error ratio in a process of error-correcting and decoding data.

It is an object of the present invention to provide a technology for decoding a low-density parity-check code while maintaining a good error ratio with a small storage capacity.

To achieve the above object, there is provided in accordance with an aspect of the present invention a decoding device for correcting errors of received data coded by a low-density parity-check code, comprising:

first storage means for storing as many items of data as the number of column vectors of a check matrix of said low-density parity-check code;

second storage means for storing the same number of data as said first storage means;

data converting means; and check node processing means;

wherein said data converting means generates first interim data held in one-to-one correspondence to said columns vectors from the data stored in said first storage means and the data stored in said second storage means;

said check node processing means generates second interim data for updating the data stored in said first storage means based on the sum of said first interim data and said received data;

said data converting means updates the data stored in said second storage means using said first interim data, and updates the data stored in said first storage means using said second interim data generated by said check node processing means; and decoded data are generated by a process carried out by said data converting means and said check node processing means.

There is provided in accordance with an aspect of the present invention a data storage device comprising:

a coding device for coding data to be stored in a storage device according to a low-density parity-check code; and a decoding device comprising first storage means for storing as many items of data as the number of column vectors of a check matrix of said low-density parity-check code, second storage means for storing the same number of data as said first storage means, data converting means, and check node processing means, wherein said data converting means generates first interim data held in one-to-one correspondence to said columns vectors from the data stored in said first storage means and the data stored in said second storage means, said check node processing means generates second interim data for updating the data stored in said first storage means based on the sum of said first interim data and said received data, said data converting means updates the data stored in said second storage means using said first interim data, and updates the data stored in said first storage means using said second interim data generated by said check node processing means, and decoded data are generated by a process carried out by said data converting means and said check node processing means.

There is provided in accordance with an aspect of the present invention a data communication system comprising:

a transmitting apparatus for transmitting data coded by a low-density parity-check code; and a receiving apparatus comprising first storage means for storing as many items of data as the number of column vectors of a check matrix of said low-density parity-check code, second storage means for storing the same number of data as said first storage means, data converting means, and check node processing means, wherein said data converting means generates first interim data held in one-to-one correspondence to said columns vectors from the data stored in said first storage means and the data stored in said second storage means, said check node processing means generates second interim data for updating the data stored in said first storage means based on the sum of said first interim data and said received data, said data converting means updates the data stored in said second storage means using said first interim data, and updates the data stored in said first storage means using said second interim data generated by said check node processing means, and decoded data are generated by a process carried out by said data converting means and said check node processing means.

There is provided in accordance with an aspect of the present invention a decoding method for correcting errors of received data coded by a low-density parity-check code, comprising:

storing as many items of data as the number of column vectors of a check matrix of said low-density parity-check code in first storage means;

storing the same number of data as said first storage means in second storage means;

generating first interim data held in one-to-one correspondence to said columns vectors from the data stored in said first storage means and the data stored in said second storage means;

generating second interim data for updating the data stored in said first storage means based on the sum of said first interim data and said received data;

updating the data stored in said second storage means using said first interim data, and updating the data stored in said first storage means using said second interim data; and generating decoded data according to a process carried out by said data converting means and said check node processing means.

BEST MODE FOR CARRYING OUT THE INVENTION

An exemplary embodiment of the present invention will be described in detail below with reference to the drawings.

Figure 1A:
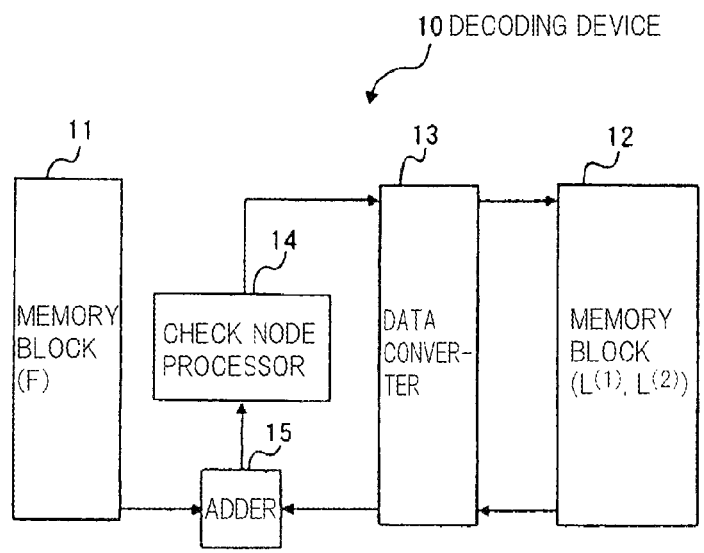
FIG. 1A is a block diagram of a configurational example of a decoding device according to an exemplary embodiment of the present invention.
Figure 1B:
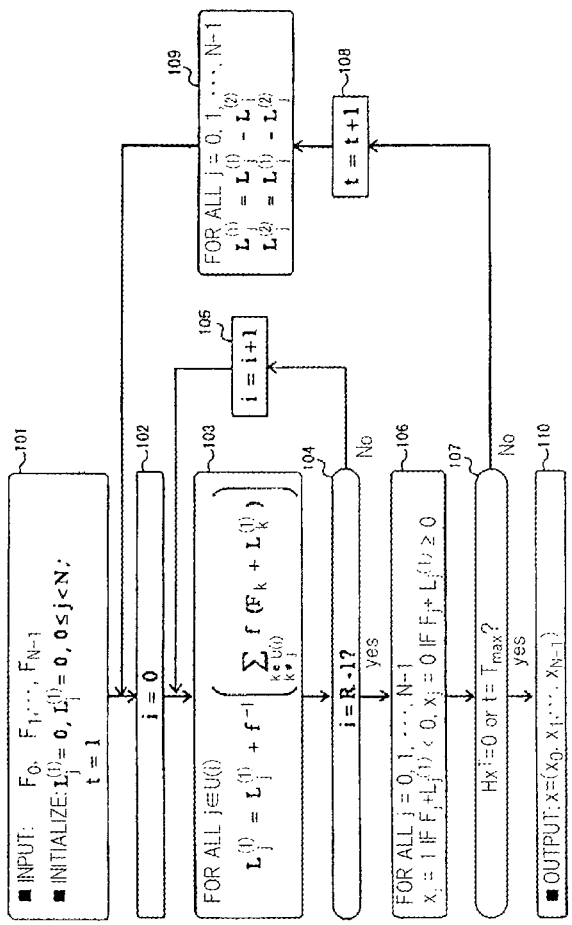
FIG. 1B is a flowchart of an operational example of the decoding device according to the exemplary embodiment.

FIG. 1A is a block diagram of a configurational example of a decoding device according to an exemplary embodiment of the present invention. FIG. 1B is a flowchart of an operational example of the decoding device according to the exemplary embodiment. The decoding device according to the exemplary embodiment is a device for receiving data from a coding device (not shown) which generates data of a low-density parity-check code and for decoding an information sequence from the data.

As shown in FIG. 1A, decoding device 10 includes memory block (F) 11, memory block ($L^{(1)}, L^{(2)}$) 12, data converter 13, check node processor 14, and adder 15. Decoding device 10 is supplied with an input comprising a received data sequence from a communication channel (not shown). The received data sequence has been coded by a low-density parity-check code. Generally received data include errors due to noise or the like. Decoding device 10 estimates a transmission bit sequence from the received data and outputs the estimated transmission bit sequence.

The low-density parity-check code is characterized by a check matrix of R rows and N columns of elements each having a value of 0 or 1, where N represents an integer greater than 1 and R a positive integer of N or smaller, as indicated by the equation (1) below:

[Equation 1]

$$H = \begin{pmatrix} h_{0,0} & h_{0,1} & h_{0,2} & \cdots & \cdots & h_{0,N-1} \\ h_{1,0} & h_{1,1} & h_{1,2} & \cdots & \cdots & h_{1,N-1} \\ \vdots & \vdots & \vdots & & & \vdots \\ \vdots & \vdots & \vdots & & & \vdots \\ h_{R-1,0} & h_{R-1,1} & h_{R-1,2} & \cdots & \cdots & h_{R-1,N-1} \end{pmatrix} \quad (1)$$

Particularly, if the check matrix according to the equation (1) can be modified into the equation (2) below by switching around a row vector and a column vector, then the low-density parity-check code can be said to be one type of a quasi-cyclic low-density parity-check code.

[Equation 2]

$$H = \begin{pmatrix} I_{0,0} & I_{0,1} & I_{0,2} & \cdots & \cdots & I_{0,n-1} \\ I_{1,0} & I_{1,1} & I_{1,2} & \cdots & \cdots & I_{1,n-1} \\ \vdots & \vdots & \vdots & & & \vdots \\ \vdots & \vdots & \vdots & & & \vdots \\ I_{r-1,0} & I_{r-1,1} & I_{r-1,2} & \cdots & \cdots & I_{r-1,r-1} \end{pmatrix} \quad (2)$$

The equation (2) represents an r×n block matrix (r=R/m, n=N/m) having elements of an m×m matrix (m represents an aliquot of N). Each of m×m matrices $I_{s,t}$ ($0 \leq s < r$, $0 \leq t < n$) represents a cyclic permutation matrix or a matrix whose elements are all zero.

It is assumed that the received data sequence from the communication channel is represented by $F_0, F_1, \ldots, F_{N-1}$, and that each symbol $F_i$ of the received data sequence is represented by b bits, where i represents an integer ranging from 0 to N−1 and b a positive integer.

Memory block (F) 11 is a device for storing received data sequence $F_0, F_1, \ldots, F_{N-1}$, and is required to have a storage capacity of b×N.

Memory block ($L^{(1)}$, $L^{(2)}$) 12 is a device for storing data $L_0^{(1)}, L_1^{(1)}, \ldots, L_{N-1}^{(1)}, L_0^{(2)}, L_1^{(2)}, \ldots, L_{N-1}^{(2)}$ which are to be temporarily held in the decoding process, and is required to have a storage capacity of 2×b×N bits. Data $L_0^{(1)}, L_1^{(1)}, \ldots, L_{N-1}^{(1)}, L_0^{(2)}, L_1^{(2)}, \ldots, L_{N-1}^{(2)}$ will be described later.

Each of R row vectors ($h_{i,0}, h_{i,1}, \ldots, h_{i,N-1}$) (i represents an integer in the range of $0 \leq i < R$) of the check matrix according to the equation (1) has its non-zero elements whose positions can be indicated according to the equation (3) below by a partial set U(i) of a set of N integers ranging from 0 to N−1. In other words, U(i) represents a set indicative of the positions of non-zero elements of an ith-row vector of the check matrix. Memory block ($L^{(1)}$, $L^{(2)}$) 12 holds the data of addresses determined by U(i). Specific operation of data converter 13, check node processor 14, and adder 15 will be described later.

[Equation 3]

$$U(i) = \{j | h_{i,j} \neq 0, 0 \leq j > N\} \quad (3)$$

Figure 2:
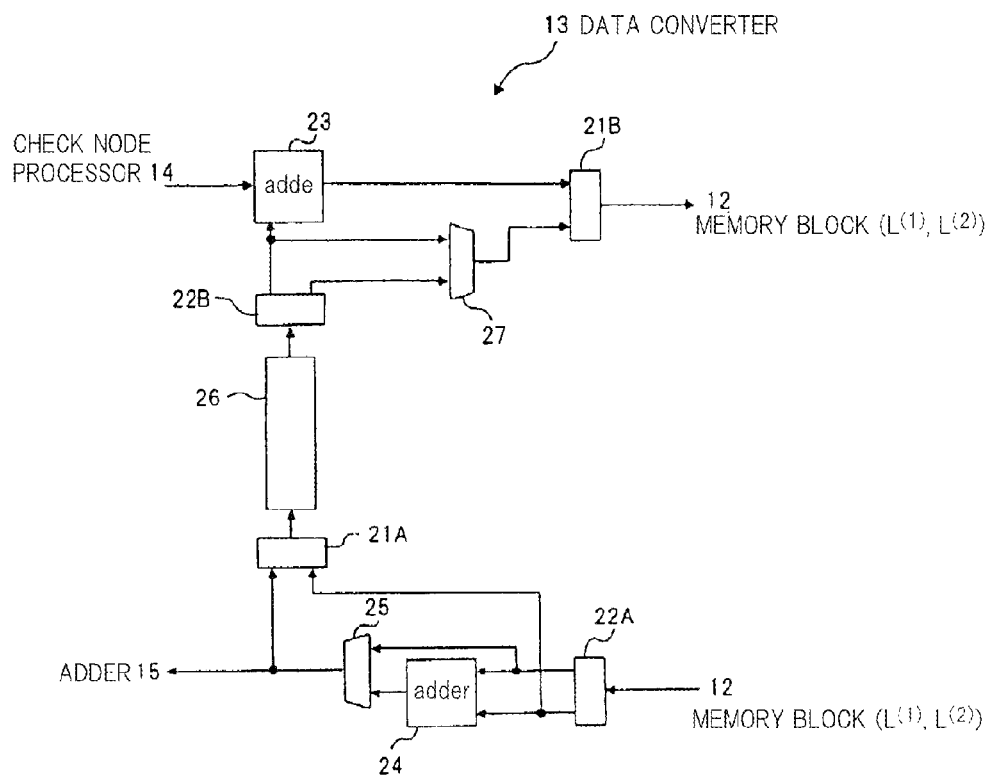
FIG. 2 is a block diagram of a configurational example of data converter 13 shown in FIG. 1A.

FIG. 2 is a block diagram of a configurational example of data converter 13 shown in FIG. 1A. As shown in FIG. 2, data converter 13 includes bit connectors 21A, 21B, bit dividers 22A, 22B, adder 23, subtractor 24, selectors 25, 27, and delay device 36.

Data converter 13 is supplied with inputs represented by 2b-bit data read from memory block ($L^{(1)}$, $L^{(2)}$) 12 shown in FIG. 1A and b-bit data output from check node processor 14. The 2b-bit data read from memory block ($L^{(1)}$, $L^{(2)}$) 12 are converted by bit divider 22A, subtractor 24, and selector 25 into 2b-bit data, which are output to adder 15 shown in FIG. 1A.

The b-bit data are delivered through bit connector 21A, delay device 26, and bit divider 22B to adder 23, which adds the b-bit data to the b-bit data output from check node processor 14. The sum data are converted by bit connector 21A into 2b-bit data, which are output to memory block ($L^{(1)}$, $L^{(2)}$) 12. The 2b-bit data are written into memory block ($L^{(1)}$, $L^{(2)}$) 12.

The configuration shown in FIG. 2 is applied to where the 2b-bit data are held at identical addresses in memory block (F) 11 shown in FIG. 1A. If the 2b-bit data are divided and held as 2 b-bit data, then bit dividers 22A, 22B and bit connectors 21A, 21B are dispensed with.

Figure 3:
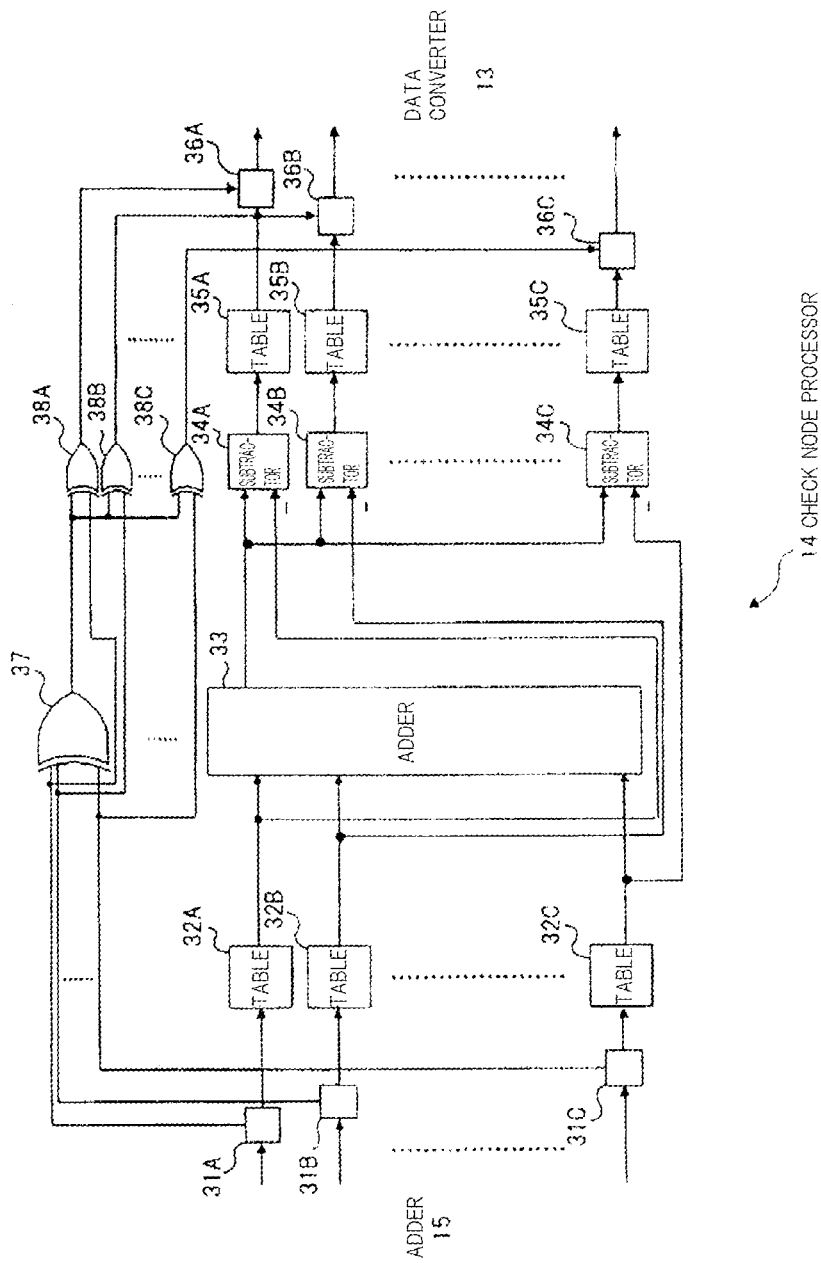
FIG. 3 is a block diagram of a configurational example of check node processor 14 shown in FIG. 1A.

FIG. 3 is a block diagram of a configurational example of check node processor 14 shown in FIG. 1A. As shown in FIG. 3, check node processor 14 includes bit dividers 31A through 31C, data conversion tables 32A through 32C, adder 33, subtractors 34A through 34C, data conversion tables 35A through 35C, bit connectors 36A through 36C, and exclusive-OR arithmetic units 37, 38A through 38C.

Check node processor 14 is supplied with an input represented by the output from adder 15 shown in FIG. 1A. The output from check node processor 14 is input to data converter 13 shown in FIG. 1A. Check node processor 14 executes the processing of step 103 in a flowchart shown in FIG. 1B.

According to an example of functions used in the processing of step 103, function $f(Z\sim)$ is represented by the equation (4) below, and inverse function $f^{-1}(Z\sim)$ by the equation (5) below.

[Equation 4]

$$f(\tilde{Z}) = (\text{sign}(\tilde{Z}), -\log \tan h(|\tilde{Z}|/2)) \quad (4)$$

Function $f(Z\sim)$ according to the equation (4) is a function for returning two values, i.e., the result of function sign which returns 1 when input $Z\sim$ is $Z\sim<0$ and returns 0 otherwise, and a value corresponding to the logarithm of a hyperbolic tangent function. Inverse function $f^{-1}(Z\sim)$ of function $f(Z\sim)$ according to the equation (4) is a function which is supplied with inputs represented by two numerical values S, Z and returns a value represented by the right side of the equation (5).

[Equation 5]

$$f^{-1}(S,Z) = (-1)^S \times 2 \tan h^{-1} \exp(-Z) \quad (5)$$

Check node processor 14 repeats the updating of the data in memory block ($L^{(1)}$, $L^{(2)}$) a given number of times. The logarithm of the hyperbolic tangent function in the equation (4) is calculated by data conversion table 32, and the function on the right side of the equation (5) is calculated by data conversion table 35.

The decoding device for the low-density parity-check code as applied to the quasi-cyclic low-density parity-check code whose check matrix is indicated by the equation (2) will be described below. The check matrix indicated by the equation (2) is a block matrix having elements of an m×m matrix (m represents an aliquot of N), as described above. It is assumed that the number p of parallel processing operations is represented by an aliquot of m.

Figure 4:
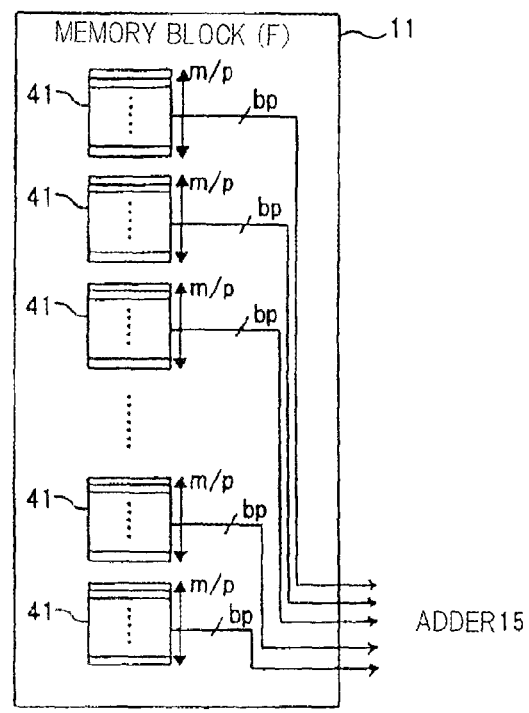
FIG. 4 is a block diagram of a configurational example of memory block (F) 11 shown in FIG. 1A.

FIG. 4 is a block diagram of a configurational example of memory block (F) 11 shown in FIG. 1A. As shown in FIG. 4, memory block (F) 11 comprises n (n=N/m) RAMs 41. Each of RAMs 41 has a bit length of by with the number of words being represented by m/p. The total storage capacity of n RAMs 41 is represented by bN bits.

Each address of each RAM 41 holds p received data. The kth ($0 \leq k < m/p$) address of jth ($0 \leq j < n$) RAM 41 holds p received data represented by the equation (6) below.

[Equation 6]

$$(F_{jm+k} F_{jm+k+m/p} F_{jm+k+2m/p} \ldots F_{jm+k+(p-1)m/p}) \quad (6)$$

The received data held in memory block (F) 11 are repeatedly referred to while the decoding process is being carried out. A process of generating read addresses for each RAM 41 will be described later.

Figure 5:
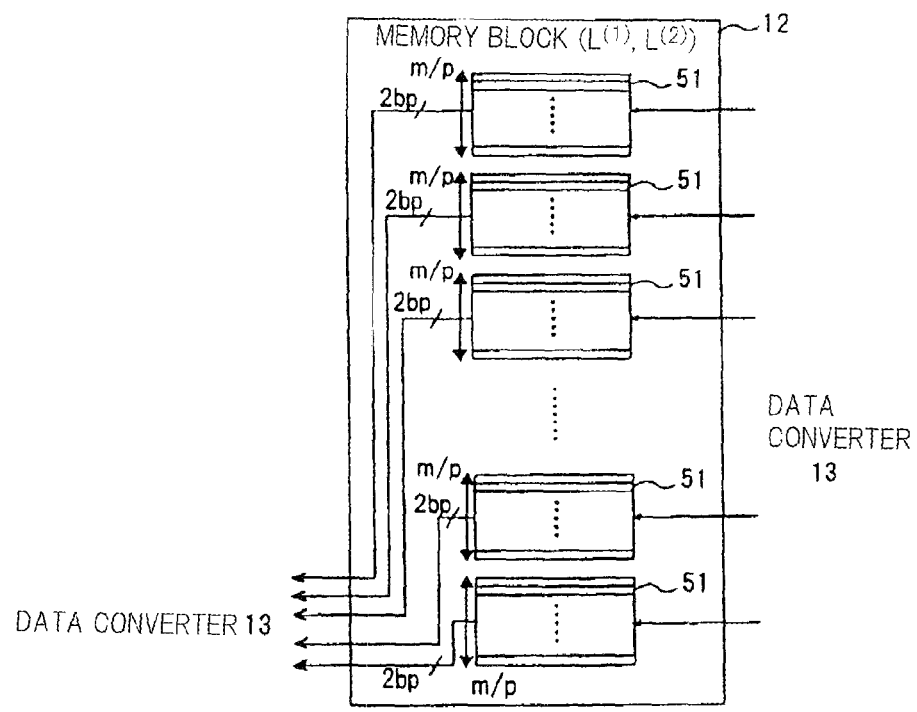
FIG. 5 is a block diagram of a configurational example of memory block ($L^{(1)}, L^{(2)}$) 12 shown in FIG. 1A.

FIG. 5 is a block diagram of a configurational example of memory block ($L^{(1)}, L^{(2)}$) 12 shown in FIG. 1A. As shown in FIG. 5, memory block ($L^{(1)}, L^{(2)}$) 12 comprises n RAMs 51. Each of RAMs 51 has a bit length of 2 bp with the number of words being represented by m/p. The total storage capacity of n RAMs 51 is represented by bN bits.

Each address of each RAM 51 holds 2p interim data. The kth ($0 \leq k < m/p$) address of the jth ($0 \leq j < n$) RAM holds 2p data represented by the equation (7) below.

[Equation 7]

$$(L_{jm+k}^{(1)} L_{jm+k+m/p}^{(1)} \ldots L_{jm+k+(p-1)m/p}^{(1)} L_{jm+k}^{(2)} L_{jm+k+m/p}^{(2)} \ldots L_{jm+k+(p-1)m/p}^{(2)}) \quad (7)$$

The data held in memory block($L^{(1)}, L^{(2)}$) 12 are repeatedly referred to and updated during the decoding process. A process of generating read addresses and write addresses for each RAM 51 will be described later.

Operation of the decoding device according to the present embodiment will be described below with reference to a flowchart shown in FIG. 1B. First, the decoding device for decoding the low-density parity-check code having the check matrix represented by the equation (1) will be described below. Then, the decoding device for decoding the quasi-cyclic low-density parity-check code having the check matrix represented by the equation (2) as applied to parallel processing will be described below.

As shown in FIG. 1B, decoding device 10 performs an initializing process (step 101). In the initializing process, decoding device 10 records the received data sequence $F_0, F_1, \ldots, F_{N-1}$ in memory block (F) 11. Each symbol $F_i$ of the received data sequence is represented by b bits ($0 \leq i < N$, b represents an integer). Decoding device 10 initializes all data $L_0^{(1)}, L_1^{(1)}, \ldots, L_{N-1}^{(1)}, L_0^{(2)}, L_1^{(2)}, \ldots, L_{N-1}^{(2)}$ in memory block ($L^{(1)}, L^{(2)}$) 12 to 0. Decoding device 10 initializes a counter for counting the number of times that the decoding process is repeated (t=1). Since the structure of the counter is obvious, it is omitted from illustration in the block diagram of FIG. 1A to avoid illustration complexities.

After the initializing process, decoding device 10 sets variable i which represents an index of the row vectors of the check matrix to an initial value of 0 (step 102).

Then, decoding device 10 updates $L_j^{(1)}$ with respect to each element j in set U(i) (see the equation (3)) which is indicative of the positions of non-zero elements of the ith vector (step 103). At this time, decoding device 10 reads data $F_j$ from memory block (F) 11 and reads data $L_j^{(1)}, L_j^{(2)}$ from memory block ($L^{(1)}, L^{(2)}$) 12. Then, decoding device 10 calculates $F_j + L_j^{(1)}$ using adder 15. Decoding device 10 calculates $F_j + L_j^{(1)}$ with respect to all js included in U(i), and inputs the calculated sums to check node processor 14. Check node processor 14 processes all integers j included in U(i), and updates $L_j^{(1)}$ into the processed results as new values. The new values are written into memory block ($L^{(1)}, L^{(2)}$) 12. During this time, data $F_j, L_j^{(1)}, L_j^{(2)}$ are accessed for each j=0, 1, ..., N−1 as many times as the number of non-zero elements of the jth column vector of the check matrix.

Decoding device 10 carries out the processing of step 103 successively with respect to i=0, 1, ..., R−1 corresponding to the row vectors of the check matrix (steps 104, 105).

Then, decoding device 10 determines $x_j$ such that $x_j=1$ when $F_j + L_j^{(1)}$ is of a negative value and $x_j=0$ otherwise (step 106). Decoding device 10 repeats the processing of steps 102 through 106 until either of the conditions that product $Hx_T$ of the check matrix and $(x_0, x_1, \ldots, x_{N-1})$ is $Hx_T=0$ and t=Tmax (maximum value of t) is satisfied (steps 107 through 109).

The processing operation (step 109) of data converter 13 shown in FIG. 2, which is actually performed at time, will be described later.

If a syndrome calculated by the product of $(x_0, x_1, \ldots, x_{N-1})$ and the check matrix obtained by the above processing is 0, then decoding device 10 estimates $(x_0, x_1, \ldots, x_{N-1})$ as a transmission data sequence, outputs the transmission data sequence, and puts an end to the decoding process (step 110). A device for calculating the product of the check matrix and $(x_0, x_1, \ldots, x_{N-1})$ is omitted from illustration in the block diagram of FIG. 1A to avoid illustration complexities.

Operation of data converter 13 in step 109 will be described below.

The processing of step 109 is a process for updating data $L_j^{(1)}, L_j^{(2)}$ in memory block ($L^{(1)}, L^{(2)}$) respectively into data $L_j^{(1)} - L_j^{(2)}, L_j^{(1)} - L_j^{(2)}$ with respect to j=0, 1, ..., N−1. The updating process is carried out once each time the decoding process is repeated. Each time the decoding process is repeated, data $L_j^{(1)}, L_j^{(2)}$ are accessed as many times as the number of non-zero elements of the jth column vector of the check matrix. Only when data converter 13 reads data $L_j^{(1)}, L_j^{(2)}$ in one access, data converter 13 updates them into $L_j^{(1)} = L_j^{(1)} - L_j^{(2)}, L_j^{(2)} = L_j^{(1)} - L_j^{(2)}$ and outputs the updated data.

FIG. 2 shows a configuration of data converter 13 when memory block ($L^{(1)}, L^{(2)}$) 12 holds 2b-bit data at each address with high-order b bits being represented by $L_j^{(1)}$ and low-order b bits by $L_j^{(2)}$. In FIG. 2, 2b-bit data are read from addresses j ($0 \leq j < N$) of memory block ($L^{(1)}, L^{(2)}$) 12 and input to data converter 13, the 2b-bit data having high-order b bits represented by $L_j^{(1)}$ and low-order b bits by $L_j^{(2)}$. The 2b-bit data are divided by bit divider 22A into high-order b bits ($L_j^{(1)}$) and low-order b bits ($L_j^{(2)}$). $L_j^{(1)}$ and $L_j^{(1)} - L_j^{(2)}$ from subtractor 24 are input to selector 25.

As described above, each time the decoding process is repeated, selector 25 selects $L_j^{(1)} - L_j^{(2)}$ when address j is accessed for the first time and selects $L_j^{(1)}$ otherwise. The output of selector 25 is output to adder 15. $L_j^{(2)}$ is connected to the low-order b bits by bit connector 21A, which inputs the connected data to delay device 26.

Delay device 26 delays the input signal by the time required by the processing operation of check node processor 14, and inputs the delayed signal to bit divider 22B. Bit divider 22B divides the input signal into high-order b bits and low-order b bits, and inputs both of them to selector 27. The high-order b bits are represented by either $L_j^{(1)}$ or $L_j^{(1)} - L_j^{(2)}$, and the low-order b bits by $L_j^{(2)}$. The high-order b bits are also input to adder 23, which adds the high-order b bits to the data from check node processor 14. The sum data from adder 23 and the b bits output from selector 27 are connected to each other by bit connector 21B, and the connected data are saved at address j in memory block ($L^{(1)}, L^{(2)}$).

Thus, data converter 13 generates data to be sent to adder 15 by selecting either data $L^{(1)}$ or the data produced by subtracting $L^{(2)}$ from $L^{(1)}$. Data converter 13 updates data $L^{(2)}$ by selecting either data $L^{(1)}$ or the data produced by subtracting $L^{(2)}$ from $L^{(1)}$.

According to the present exemplary embodiment, as described above, the data held in memory block ($L^{(1)}, L^{(2)}$) 12 are converted and processed to produce a decoded result. Since only the total of 2b-bit data made up of b-bit data $L^{(1)}$ and since b-bit data $L^{(2)}$ may be held with respect to each column vector of the check matrix, the storage capacity for holding data may be smaller than with the existing decoding method.

Specifically, according to the present exemplary embodiment, the total of 2b-bit data $L^{(1)}, L^{(2)}$ are held with respect to the jth vector (j=0, 1, ..., N−1), for example, and are updated and processed. The decoding method according to the present exemplary embodiment requires a smaller storage capacity for holding data than the existing decoding method which holds b-bit data with respect to each row vector, e.g., the ith vector (i=0, 1, ..., R−1), and the elements of set U(i), and updates and processes the data.

Decoding device 10 according to the present exemplary embodiment holds received data in memory block (F) 11 of its own and processes the received data. However, the present invention is not limited to such a configuration. According to another example, a recording medium recording therein data coded by the low-density parity-check code may be loaded into decoding device 10, and decoding device 10 may refer to and decode the data recorded in the recording medium. In this case, memory block (F) 11 is dispensed with.

Decoding device 10 according to the present exemplary embodiment sequentially repeats a sequence of reading data with respect to each column vector, performing a check node process thereon to update the data, and storing the data. However, the present invention is not limited to such a configuration. According to another example, a parallel processing sequence may be introduced to speed up the above decoding process.

A parallel processing sequence which is applied to the decoding process for decoding the quasi-cyclic low-density parity-check code having the check matrix indicated by the equation (2) will be described below. It is assumed that the number p of parallel processing operations is represented by an aliquot of m, which represents the size of cyclic matrices as elements of the check matrix indicated by the equation (2). In this case, memory block (F) 11 and memory block ($L^{(1)}, L^{(2)}$) 12 are identical in configuration to those shown in FIGS. 4 and 5, respectively. The data structures in the RAMs in the memory blocks are the same as those represented by the equations (6), (7). The number of RAMs included in each memory block is n. The process of generating addresses for accessing each RAM is the same for memory block (F) 11 and memory block ($L^{(1)}, L^{(2)}$) 12, as with the above exemplary embodiment for sequential processing. Therefore, only memory block ($L^{(1)}, L^{(2)}$) 12 will be described below. r initial address values A (i,j) ($0 \leq i < r$, $0 \leq j < n$) are assigned to each of the n RAMs. The ith Initial address value A (i,j) of the jth RAM is determined as follows:

[Equation 8]

$$A(i,j) = k^{(i,j)} \mod(m/p) \quad (8)$$

where $k^{(i,j)}$ represents an integer indicative of the positions of non-zero elements in the 1st-row vector of an m×m cyclic permutation matrix $I_{i,j}$ which is an (i,j) element of the check matrix according to the equation (2) ($0 \leq k^{(i,j)} < m$). Address value A (i,j) is in conformity with the remainder produced by dividing $k^{(i,j)}$ by m/p. Addresses for reading data from and writing data in each RAM are all generated in r patterns. The r patterns are identical in that only the initial address values are different and subsequent addresses are generated simply by adding 1.

Each pattern for generating addresses varies in periods of an unit time of m/p. For example, the first initial address value of the jth RAM is A(0,j), and the data according to the equation (7) where k=A(0,j) are read. Then, data at address value A(0,j)+1 are read according to the equation (7) where k=A(0, j)+1. Subsequently, 1 is added likewise to the address value. However, an address value next to address value m/p−1 is 0, and thereafter data are similarly read until data are read from address value A(0,j)−1.

Data that are read next are those corresponding to initial address value A(1,j). Subsequently, data are read according to a process similar to the above process. The same process that is carried out for all initial address value A(i,j) of the r patterns with respect to i=0, 1, ..., r−1 corresponds to one repetitive decoding process. After one repetitive decoding process is finished, control then goes back to the starting point, and the same process is repeated as many times as the maximum number of repetitions.

Addresses for n RAMs can be generated using a MOD (m/p) counter. The MOD (m/p) counter outputs a 1-bit signal at the time the counter value (address value) changes from m/p−1 to 0. The MOD (m/p) counter is used in shifting circuits 62, 63 in a parallel check node processor shown in FIG. 6.

Each item of data according to equation (7) read from memory block ($L^{(1)}, L^{(2)}$) 12 has its data width increased from 2b bits to 2bp bits and is input to a parallel data converter. The parallel data converter has a processing sequence which is similar to the processing sequence of data converter 13 shown in FIG. 2, and includes n data converters 13 that are as many as the number of RAMs. bp-bit data corresponding to an $L^{(1)}$ part obtained by the parallel data converter are added to the bp-bit data according to the equation (6) read from memory block (F) 11. The addition is carried out with respect to each unit of b bits.

The n bp-bit data which are as many as the number of RAMs, generated by the above addition sequence, are all input to the parallel check node processor.

Figure 6:
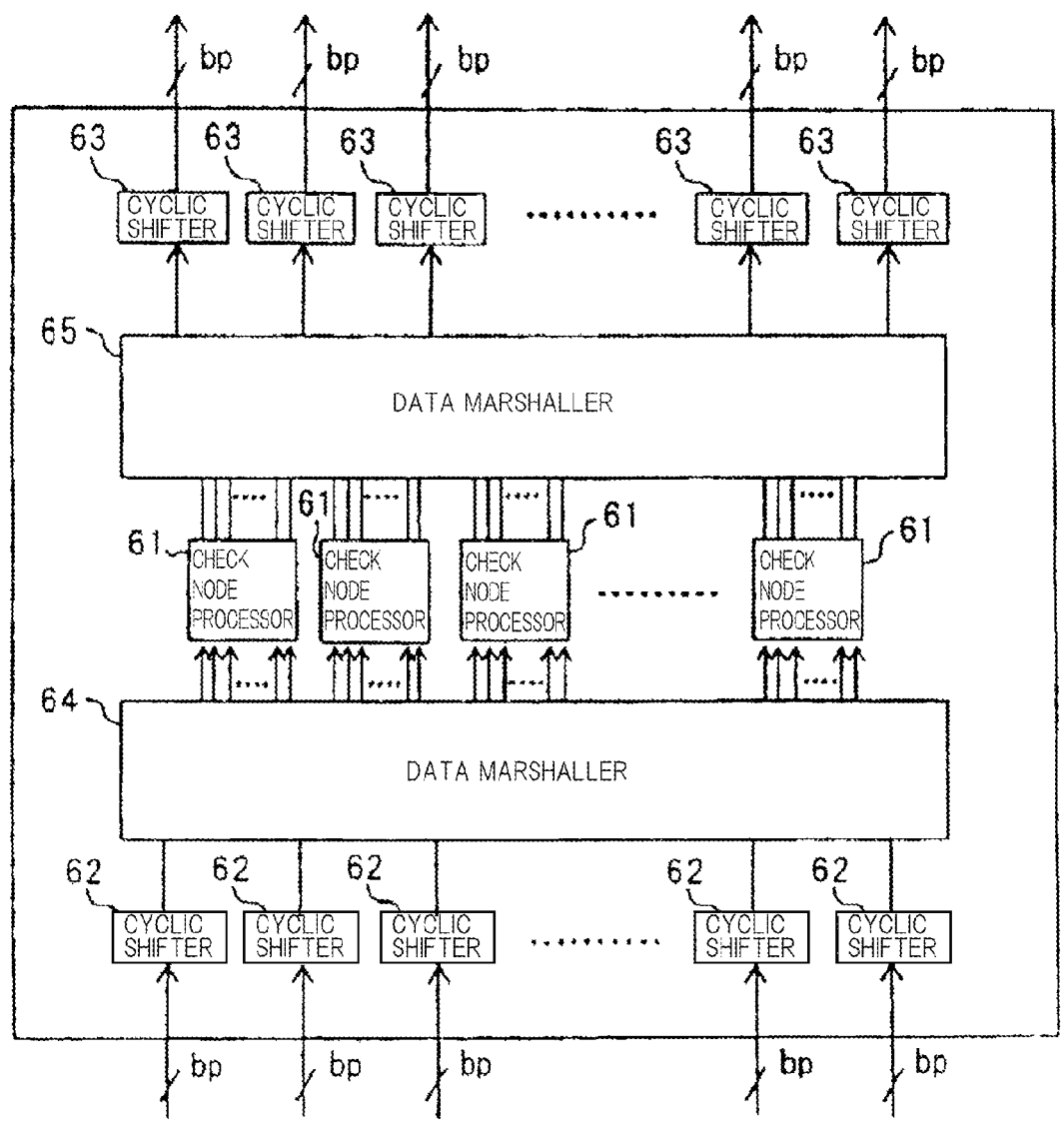
FIG. 6 is a block diagram of a parallel check node processor.

FIG. 6 is a block diagram of the parallel check node processor. The parallel check node processor carries out the processing of step 103 shown in FIG. 1B in p parallel operations.

As shown in FIG. 6, the parallel check node processor includes p check node processors 61, 2n shifting circuits 62, 63, and 2 data marshallers 64, 65. Check node processors 61 are identical to check node processor 14 shown in FIG. 3. Shifting circuits 62,63 are supplied with inputs represented by b×p-bit information, cyclically shift the input information for each unit of b bits, and output the shifted information. The shifting quantity of shifting circuits 62, 63 is determined depending on the check matrix represented by the equation (2).

In the parallel check node processor shown in FIG. 6, each of the n bp-bit data is input to one of the shifting circuits 62. The parallel check node processor has n shifting circuits 62 each supplied with the bp-bit data. Each shifting circuit 62 cyclically shifts the input bp-bit data for each unit of b bits by a predetermined quantity, and outputs the shifted data. The shifting quantity is determined according to equation (9) below based on the initial address value (see equation (9)) with respect to the RAMs.

[Equation 9]

$$s(i,j)=(k^{(i,j)}-A(i,j))/(m/p) \qquad (9)$$

The shifting quantity which corresponds to the jth RAM data that are successively read from initial address value A(i,j) to address value m/p−1 is in agreement with s(i,j) according to equation (9). The shifting quantity which corresponds to the jth RAM data that are successively read from address value 0 to address value A(i,j)−1 is in agreement with s(i,j)+1. If s(i,j)+1=p, then the shifting quantity is 0 and the shifting circuit outputs the input as is. As described above with respect to the generation of addresses for the RAMs, the shifting quantity switches from s(i,j) to s(i,j)+1 using a 1-bit signal at the time the address value changes from m/p−1 to 0.

Each of the outputs from n shifting circuits 62 is of by bits. Data marshaller 64 is a device for generating inputs to the p check node processors from the outputs from n shifting circuits 62. Data marshaller 64 is supplied with inputs represented by the outputs bp-bits from the n shifting circuits, arranges n data $(d_0^{(j)}, d_1^{(j)}, \ldots, d_{p-1}^{(j)})$ where j=0, 1, ..., n−1 which are provided by dividing the bp-bits for each unit of b bits to generate data $(d_i^{(0)}, d_i^{(1)}, \ldots, d_i^{(n-1)})$ where i=0, 1, ..., p−1, and outputs them to corresponding check node processors 61.

p check node processors 61 are supplied with inputs represented by nb-bit data $(d_i^{(0)}, d_i^{(1)}, \ldots, d_i^{(n-1)})$, perform a predetermined processing sequence on them, and output nb-bit data as the processed results. p output data each comprising nb bits are input to data marshaller 65. Data marshaller 65 arranges the p nb-bit output data into n bp-bit data and inputs them to respective shifting circuits 63 according to a process which is inverse to the process carried out by data marshaller 64. Shifting circuits 63 serve to undo the cyclic shifting process carried out by shifting circuits 62. In other words, the sum of the shifting quantity of shifting circuits 63 and the shifting quantity of shifting circuits 62 agrees with p or 0. The data output from the parallel check node processor shown in FIG. 6 are processed by a process identical to the process carried out by the above sequential check node processor according to the exemplary embodiment. According to the exemplary embodiment, however, n data converters 13 perform parallel processing operations.

Figure 7:
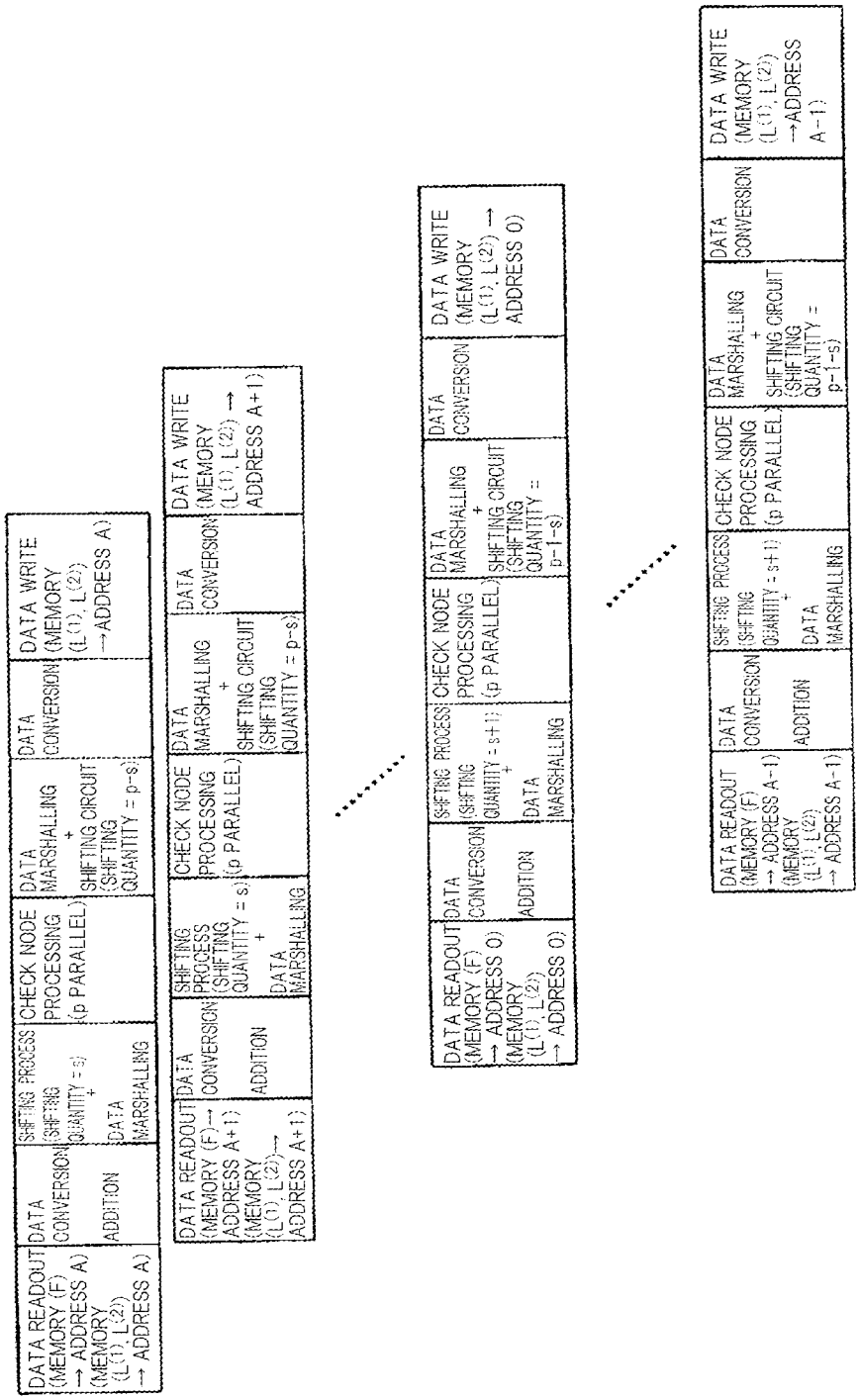
FIG. 7 is a timing chart showing a chronological sequence of operation of the decoding device according to the exemplary embodiment.

FIG. 7 is a timing chart showing a chronological sequence of operation of the decoding device according to the exemplary embodiment. The decoding process is started while the received data are being held in the n RAMS of memory block (F) 11. The received data held in the n RAMS of memory block (F) 11 comprise n×p×(m/p) symbols where one symbol=b bits. FIG. 7 shows processing flows in one period as regards updating of the data in one of the n RAMs in memory block (F) 11 and memory block $(L^{(1)}, L^{(2)})$ 12. The processing flow for the other n−1 RAMs is the same as the processing flow shown in FIG. 7 except for the setting of the initial address value and the shifting quantity of the shifting circuits.

In the processing flow in the uppermost stage, data of b-bits×p are read from memory block (F) 11 and data of b bits×p×2 are read from memory block $(L^{(1)}, L^{(2)})$ 12, using set initial address value A (see the equation (8)), and input through the adder or the data converter and the adder to shifting circuits 62. The data converting process separates the data of b bits×p×2 into high-order b bits×p and low-order b bits×p, calculates the difference and connects the data. The data converting process is basically the same as the process of above data converter 13. The process of above data converter 13 is the same as the above data converting process where p=1.

Initial shifting quantity s is determined by initial address value A and equation (9). Outputs from shifting circuits 62 and the data introduced from the other n−1 RAMS via shifting circuits 62 are arranged by data marshaller 64, and input to check node processors 61. The data processed by check node processors 61 are arranged by data marshaller 65 according to a process which is inverse to the process of data marshaller 64, and thereafter are shifted by shifting circuits 63. The data of b bits×p are connected to the data of b bits×p by the data converter. The connected data of b bits×p×2 are written into address value A of the RAMs of memory block $(L^{(1)}, L^{(2)})$ 12.

The above process is executed on the RAM data held at address values A+1, A+2, according to the pipeline processing shown in FIG. 7. When a first period, for example, is finished, the initial address value and the shifting quantity are set again, and a second period is carried out to update the RAM data. The process is performed for all r address values. When the total r period is finished, one decoding process is ended. The whose sequence is repeated a maximum indicated number of times.

According to the above exemplary embodiment, in the check node processing of step 103 shown in FIG. 1B, equations (4) and (5) are used to calculate $L_j^{(1)}$ based on the logarithm of the hyperbolic tangent function. However, the present invention is not limited to such a calculation. According to another example, $L_j^{(1)}$ may be calculated according to the equation (10) below.

[Equation 10]

$$L_j^{(1)} = L_j^{(1)} + \prod_{\substack{k \in U(i) \\ k \neq j}} \text{sign}(F_k + \beta L_k^{(1)}) \cdot \min_{\substack{k \in U(i) \\ k \neq j}} |F_k + \beta L_k^{(1)}| \qquad (10)$$

The check node processing sequence according to equation (10) necessarily requires $(F_k + \beta L_k^{(1)})$ as the input from the adder. Therefore, when adder 15 adds the data from memory (F) 11 and the data obtained from memory block $(L^{(1)}, L^{(2)})$ 12 via data converter 13, it weighs the data obtained from memory block $(L^{(1)}, L^{(2)})$ 12 via data converter 13. In the equation (10), β represents a weight. Weight value β may be adjusted depending on the selection of the check matrix (the equation (1), the equation (2)). Weight value β may not necessarily need to be constant, but may be varied adaptively.

If the most significant bits of the input represent the positive or negative polarity and the remaining bits represent an absolute value, then the check node processing sequence according to equation (10) may calculate the exclusive-OR-ing of the most significant bits and the minimum value of the remaining bits. The check node processing sequence according to equation (10) thus makes it unnecessary to use tables 32, 35 which are required by the use of the logarithmic function of the hyperbolic tangent function in check node processing according to equation (4) and the equation (5). As a result, check node processing can be implemented by a simple comparing circuit.

A data communication system incorporating the above decoding device will be described by way of illustrative example.

Figure 8:
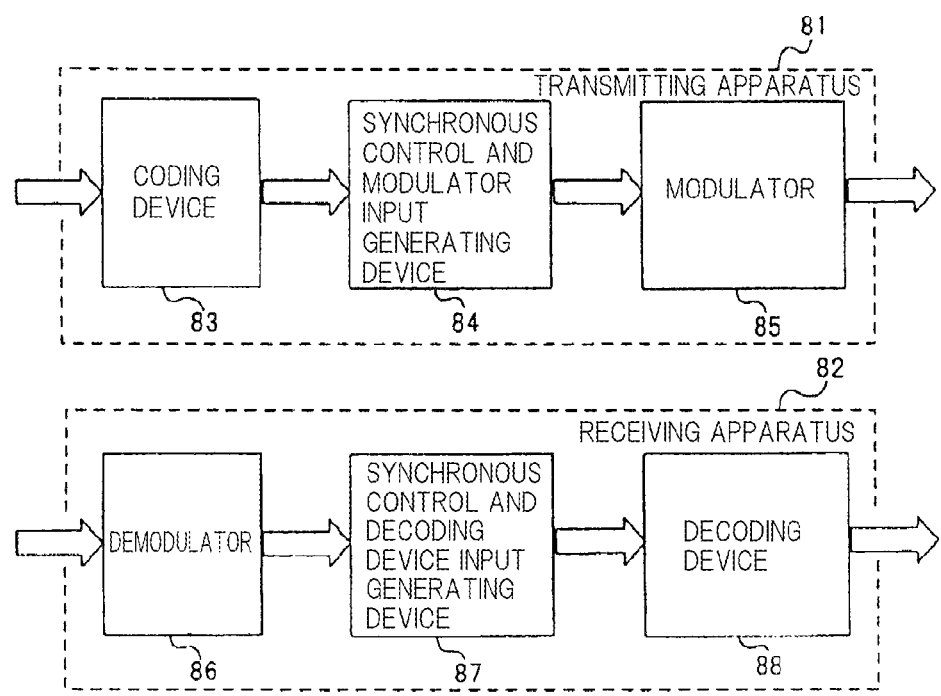
FIG. 8 is a block diagram of a configuration of a data communication system which incorporates the decoding device according to the exemplary embodiment.

FIG. 8 is a block diagram of a configuration of a data communication system which incorporates the decoding device according to the exemplary embodiment. As shown in FIG. 8, data communication system 80 comprises transmitting apparatus 81 and receiving apparatus 82.

Transmitting apparatus 81 includes coding device 83, synchronous control and modulator input generating device 84, and modulator 85. Coding device 83 outputs data coded by the low-density parity-check code. Synchronous control and modulator input generating device 84 includes the coded data output from coding device 83 into a frame for synchronizing receiving apparatus 82, converts the coded data into data that matches the modulating process of modulator 85, and outputs the converted data. Modulator 85 modulates the data from synchronous control and modulator input generating device 84 according to its modulating process and outputs the modulated data. The output data from modulator 85 are transmitted through a communication channel and then received by receiving apparatus 82.

Receiving apparatus 82 includes decoding demodulator 86, synchronous control and decoding device input generating device 87, and decoding device 88. Demodulator 86 receives the signal from the communication channel, demodulates the signal according to a process corresponding to the modulating process of modulator 85, and outputs the demodulated data. Synchronous control and decoding device input generating device 87 synchronizes with the frame of the data output from demodulator 86, converts the data into data matching the input of decoding device 86, and outputs the converted data. Decoding device 88 decodes the low-density parity-check code from the data output from synchronous control and decoding device input generating device 87 according to the process described in the above exemplary embodiment, and outputs the decoded data.

The decoding device according to the above exemplary embodiment is illustrated as being applied to the communication system. However, the decoding device may be used in other applications. According to another example, the above decoding device may be used in a data storage system. Specifically, in a data storage system which employs an error correcting technology for increasing the reliability of the stored data, date coded by the low-density parity-check code may be stored in a storage device, and the data read from the storage device may be decoded by the decoding device.

A specific example of the above decoding method based on numerical example will be described below.

It is assumed that the check matrix according to the equation (1) has a size of N=4095 and R=504. It is also assumed that set U(i) defined by the equation (2) has i in the range of 0≦i<504 and the numbers of elements of U(i) are all in conformity with 64. A communication system, for example, which employs the decoding method can be used as a system for transferring a bit sequence in units of frames having a frame length of 4095 bits. Generally, about 10% of one frame serves as a redundant area for correcting errors. If the bit width b of each symbol of data input to the decoding device is of 6 bits, then the decoding device is required to have a storage capacity of 4095×6 bits for memory block (F) 11 and a storage capacity of 2×4095×6 bits for memory block ($L^{(1)}$, $L^{(2)}$) 12. Comparison of this numerical example with the decoding device using the existing decoding method disclosed in Document 4 indicates that the storage capacity according to the numerical example is reduced by about 75%. Any reduction in the error ratio is held to about 0.1 to 0.2 dB.

The present invention has been described above in reference to the exemplary embodiment. However, the present invention is not limited to the above exemplary embodiment. Rather, changes that can be understood by those skilled in the art within the scope of the invention may be made to the arrangements and details of the present invention.

The present application claims priority based on Japanese patent application No. 2007-321928 filed on Dec. 13, 2007, and incorporates herein the entire disclosure thereof by reference.

The invention claimed is:

1. A decoding device for correcting errors of received data coded by a low-density parity-check code, comprising:
   first storage that stores as many items of data as the number of column vectors of a check matrix of said low-density parity-check code;
   second storage that stores the same number of data as said first storage;
   data converter; and
   check node processor;
   wherein, said data converter generates first interim data held in one-to-one correspondence to said columns vectors from the data stored in said first storage means and the data stored in said second storage;
   said check node processor generates second interim data for updating the data stored in said first storage based on the sum of said first interim data and said received data;
   said data converter updates the data stored in said second storage using said first interim data, and updates the data stored in said first storage using said second interim data generated by said check node processor; and
   decoded data are generated by a process carried out by said data converter and said check node processor.

2. The decoding device according to claim 1, wherein the process carried out by said data converter and said check node processor is repeated to repeatedly update the data stored in said first storage and the data stored in said second storage thereby to generate said decoded data.

3. The decoding device according to claim 1, wherein said data converter:
   generates said first interim data by selecting either the data stored in said first storage or data produced by subtracting the data stored in said second storage from the data stored in said first storage; and
   updates the data stored in said second storage by selecting either the data stored in said second storage or data produced by subtracting the data stored in said second storage from the data stored in said first storage.

4. The decoding device according to claim 1, wherein said check node processor generates the second interim data for updating data, among the data stored in said first storage, which correspond to said column vectors, from the sum of said first interim data held in one-to-one correspondence to said columns vectors which cross non-zero elements of each of row vectors of said check matrix, and said received data; and
   said data converter selects data produced by subtracting the data stored in said second storage from the data stored in said first storage as said first interim data each time the updating of the data by said check node processor is finished for all the row vectors, and selects the data produced by subtracting the data stored in said second storage from the data stored in said first storage as the updated data for the data stored in said second storage.

5. The decoding device according to claim 4, wherein said low-density parity-check code comprises a quasi-cyclic low-density parity-check code in which said check matrix comprises a cyclic permutation matrix having a size of m (m represents a positive integer) or a block matrix of r rows and n columns (n, m represent positive integers) having elements each of a zero matrix;

each of said first storage and said second storage comprises n random access memories with the number of words being represented by m/p (p represents a aliquot of m);

said data converter includes a maximum of n data converters for parallel processing;

said check node processor comprising a maximum of n first shifting circuits for cyclically shifting data having a length p from said data converters, a first data marshaller for arranging a maximum of n data having a length of p from said maximum of n first shifting circuits into p data having a maximum length of n, p check node processors for performing parallel processing on the p data from said first data marshaller, a second data marshaller for arranging the p data having the maximum length of n from said p check node processors into a maximum of n data having a length of p, and a maximum of n second shifting circuits for cyclically shifting the maximum of n data from said second data marshaller in a process which is inverse to a cyclic shifting process of said first shifting circuits; and said check node processor and said data converter updates the data stored in said first storage and the data stored in said second storage by a maximum of n data parallel to each other.

6. A data storage device comprising:

a coding device for coding data to be stored in a storage device according to a low-density parity-check code; and a decoding device comprising first storage that stores as many items of data as the number of column vectors of a check matrix of said low-density parity-check code, second storage that stores the same number of data as said first storage, data converter, and check node processor, wherein said data converter generates first interim data held in one-to-one correspondence to said columns vectors from the data stored in said first storage and the data stored in said second storage, said check node processor generates second interim data for updating the data stored in said first storage based on the sum of said first interim data and said received data, said data converter updates the data stored in said second storage using said first interim data, and updates the data stored in said first storage using said second interim data generated by said check node processor, and decoded data are generated by a process carried out by said data converter and said check node processor.

7. A decoding method for correcting errors of received data coded by a low-density parity-check code, comprising:

storing as many items of data as the number of column vectors of a check matrix of said low-density parity-check code in first storage;

storing the same number of data as said first storage in second storage;

generating first interim data held in one-to-one correspondence to said columns vectors from the data stored in said first storage and the data stored in said second storage;

generating second interim data for updating the data stored in said first storage based on the sum of said first interim data and said received data;

updating the data stored in said second storage using said first interim data, and updating the data stored in said first storage using said second interim data; and generating decoded data according to a process carried out by said data converter and said check node processor.

* * * * *